United States Patent [19]

Jeng et al.

[11] Patent Number: 5,374,481
[45] Date of Patent: Dec. 20, 1994

[54] POLYEMITTER STRUCTURE WITH IMPROVED INTERFACE CONTROL

[75] Inventors: Shwu Jen Jeng, Fishkill; Jerzy Kanicki, Katonah; David E. Kotecki, Hopewell Junction; Christopher C. Parks, Beacon, all of N.Y.; Zu-Jean Tien, Saratoga, Calif.

[73] Assignee: International Business Machines Corporation, Armonk, N.Y.

[21] Appl. No.: 102,399

[22] Filed: Aug. 5, 1993

Related U.S. Application Data

[63] Continuation of Ser. No. 794,933, Nov. 20, 1991, abandoned.

[51] Int. Cl.⁵ .......................................... H01L 29/72
[52] U.S. Cl. ............................... 428/336; 257/537;
257/538; 257/636; 257/646; 361/322; 428/446;
428/469; 428/472; 428/701; 428/702; 428/698
[58] Field of Search ................ 257/646, 636, 537, 538;
361/322; 428/446, 336, 472, 701, 702, 698, 469

[56] References Cited

U.S. PATENT DOCUMENTS

| | | | |
|---|---|---|---|
| 3,881,242 | 5/1975 | Nuttall | 29/589 |
| 4,133,701 | 1/1979 | Greenstein et al. | 148/1.5 |
| 4,208,781 | 6/1924 | Rao et al. | 29/577 C |
| 4,357,179 | 11/1982 | Adams et al. | 148/1.5 |
| 4,441,249 | 4/1984 | Alspector et al. | 29/577 C |
| 4,668,530 | 5/1987 | Reif et al. | 427/55 |
| 4,755,480 | 7/1988 | Yan et al. | 437/47 |
| 4,874,716 | 10/1989 | Rao | 437/43 |
| 4,966,866 | 10/1990 | Mikata et al. | 437/193 |
| 4,977,104 | 12/1990 | Sawada et al. | 437/162 |
| 5,028,973 | 7/1991 | Bajor | 357/34 |

FOREIGN PATENT DOCUMENTS 63-274175 1/1987 Japan.

OTHER PUBLICATIONS

Kitagawa et al., Low temperature Preparation of Doped Hydrogenated Amorphous Silican Films by AC-Biased Microwave ECR Plasma CVD Method Jap. J. of Applied Physics, vol. 29, No. 10, Oct., 1990, pp. L1753-L1756.
Collins et al., 1989, J. Vac. Sci. Technol. B. 7:1155-1164.
Collins, 1986. Appl. Phys. Lett. 48:843-845.
Ronsheim et al., J. Appl. Phys., 69(1) Jan. 1991, pp. 495-498.
Fujioka, Fujitsu Sci. Tech. J., 24, 4, Dec. 1988, pp. 391-397.
Graaf et al. "The SIS Tunnel Emitter: A Theory for Emitters with Thin Interface Layer" IEEE Transactions on Electronic Devices. vol. ED-26, No. 11, Nov. 1979.

*Primary Examiner*—A. A. Turner
*Attorney, Agent, or Firm*—Whitham, Curtis, Whitham & McGinn

[57] ABSTRACT

A polyemitter structure having a thin interfacial layer deposited between the polysilicon emitter contact and the crystalline silicon emitter, as opposed to a regrown $SiO_x$ layer, has improved reproducibility and performance characteristics. A n-doped hydrogenated microcrystalline silicon film can be used as the deposited interfacial film between a crystalline silicon emitter and a polycrystalline silicon contact.

2 Claims, 3 Drawing Sheets

POLYEMITTER STRUCTURE WITH IMPROVED INTERFACE CONTROL

This application is a continuation of Ser. No. 794,933, filed on Nov. 20, 1991, now abandoned.

BACKGROUND OF THE INVENTION

1. Field of the Invention

The present invention is generally related to polyemitter structures and, more particularly, to an interface layer in a polyemitter structure and its method of formation.

2. Description of the Prior Art

Polycrystalline silicon (polysilicon) and single-crystal silicon have been investigated for many years because of their importance in semiconductor device manufacturing. Polysilicon films have been used in the past as a contact to the emitter and base of a transistor. The presence of an interface layer between the polysilicon and the emitter results in enhanced bipolar transistor current gain (See, de Graff et al., *IEEE Trans. Electron. Devices*, ED-26, 1771 (1979)). As is explained in Ronsheim et al., *J. Appl. Phys.*, 69(1) 495–498 (1991), which is herein incorporated by reference, an oxide interface layer provides a barrier which reduces hole injection from the base to the emitter contact.

The use of an interfacial oxide to adjust the current gain of a bipolar transistor requires control of the thickness and continuity of the oxide film if device uniformity is to be achieved. However, achieving good control is often difficult and poses a major problem in polyemitter processing. If a cleaned silicon wafer is subsequently exposed to air, a native $SiO_x$ layer containing mostly oxygen with small amounts carbon, fluorine, aluminum, chlorine, and arsenic of will form. Similar to that described in Kern et al., R. C. A. Rev., 31, 187 (1970), which is herein incorporated by reference, wafers are typically cleaned using an "RCA" cleaning procedure which is performed by successively exposing a silicon wafer to NaOH, $H_2O_2$, $H_2O$, HCl, $H_2O_2$, and $H_2O$ possibly followed by exposure to HF and an $H_2O$ rinse. The thickness of the native $SiO_x$ layer grown after cleaning is dependent upon the time between cleaning the silicon wafer and deposition of the polysilicon, as well as the temperature and $H_2O$ and $O_2$ partial pressures the wafer is exposed to primor to deposition. A large contribution to the total oxide layer can occur during the loading of the wafers in the low pressure chemical vapor deposition (LPCVD) chamber. The loading process can also produce large $SiO_x$ thickness variations, since the wafers loaded in the LPCVD chamber first will be exposed to a higher temperature for a longer period of time than the wafers loaded last. Generally, the native layer is on the order of 3–12 Å thick.

In order for the interface layer to fulfill its electrical function of acting as a barrier which reduces the transport of holes from the base to the emitter contact while still maintaining high electron conduction, the oxide layer needs to have an integrated oxygen content on the order of $10^{15} cm^{-2}$. The importance of the integrated oxygen content is discussed in Ronsheim et al., *J. Appl. Phys.*, 69(1) 495–498 (1991), noted above. If a silicon wafer is cleaned and exposed to HF and subsequently dried under nitrogen without an additional water wash or exposure to ambient air, the oxide layer remaining on the silicon will typically contain less than $7*10^{14} cm^{-2}$, which is approximately three times lower than the optimal oxygen content of the interfacial layer. If a polysilicon emitter were deposited on an oxide layer having such a low oxygen content, devices with low $\beta$ values (i.e., $\beta < 50$) will result because of the excessive back injection of holes from the base to the emitter contact.

N-type microcrystalline hydroganated silicon (n-$\mu$c-Si:H) has been under recent investigation. Previous reports of the band structure between n-$\mu$c-Si:H and crystalline silicon (c-Si) have shown that the band discontinuity occurs almost entirely in the valence band. Because there is minimal discontinuity in the conduction band, there should be minimal suppression to electron conduction. Fujitsu & Talasaki, Characteristics of Si HBT with *Hydrogenated Micro-Crystalline Si Emitter*, 24 Fujitsu Sci. Tech. J. 391–7 (1988), for example, disclose a wide-band gap emitter in which a n-$\mu$c-Si:H film is deposited onto crystalline Si in a plasma CVD system and Al is deposited as an emitter contact by sputtering. Fujitsu et al. does not mention the use of thin films or n-$\mu$c-Si:H in polyemitters or the use of n-$\mu$c-Si:H in combination with polysilicon contacts, nor does Fujitsu et al. discuss critical ratios of gases, power density and pressure which are required to produce thin films of n-$\mu$c-Si:H. Other previously reported work on n-$\mu$c-Si:H emitter contacts has focussed on thick (350 Å) contact layers. Thick layers of n-$\mu$c-Si:H are not desirable because they contribute to a large emitter resistance.

SUMMARY OF THE INVENTION

It is therefore an object of the invention to provide an improved method of making high performance polyemitter structures which includes depositing an interface film having controlled properties, as opposed to having the interface form naturally in an uncontrolled manner, on the silicon emitter prior to deposition of the polysilicon contact.

It is another object of the invention to provide a polyemitter structure which includes a polysilicon contact and an interface film of n-type microcrystalline hydrogenated silicon (n-$\mu$c-Si:H).

It is yet another object of the invention to provide a controlled and reproducible method of depositing a contiguous interfacial layer of n-$\mu$c-Si:H.

According to the invention, a crystalline-silicon emitter on a wafer is cleaned using the RCA cleaning technique followed by an HF acid treatment to yield a very thin $SiO_2$ layer with less than $7 \times 10^{14}$ cm$^{-2}$ of $O_2$. An interfacial wide band gap film is then deposited contiguously on the wafer. The deposited wide band gap film will perform the same electrical function as an accidentally or naturally grown $SiO_x$ interfacial layer present in prior art polyemitters, that is, it will act as a barrier to reduce hole injection from the base to the emitter contact. However, because the wide band gap film is deposited under controlled conditions, its properties are less subject to the chance variations found in polyemitter structures with accidentally or naturally grown $SiO_x$. In a particular embodiment, the interfacial film is n-$\mu$c-Si:H which is less than 50 Å thick. The reduced thickness of the n-$\mu$c-Si:H film assures minimum emitter resistance. Without exposing the interfacial film to air, in-situ doped n-type polysilicon is then deposited for the emitter contact.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1A:
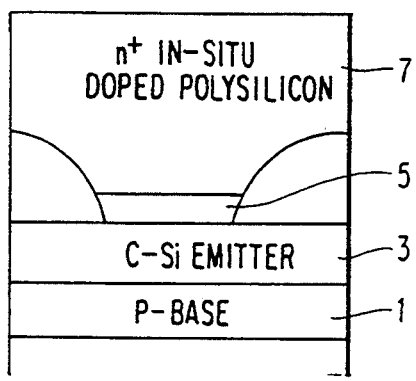
FIGS. 1a, 1b and 1c are cross-sectional views of alternative polyemitter structures made in accordance with the present invention.
Figure 1B:
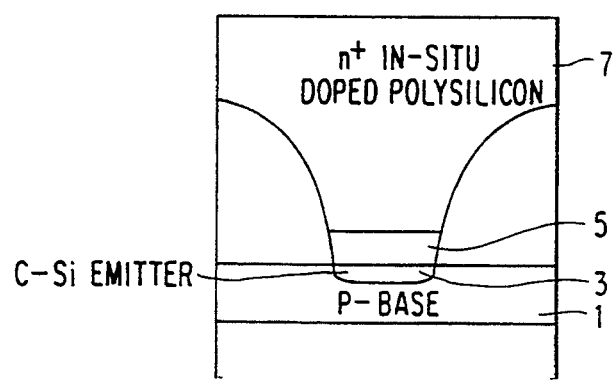
Figure 1C:
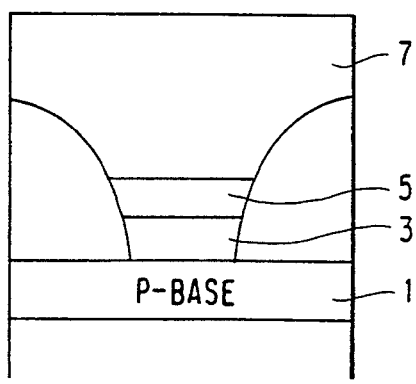

Referring now to the drawings, and more particularly to FIGS. 1a–c, which show alternative polyemitter structures made in accordance with the present invention and in which like reference numbers indicate like parts, a silicon wafer comprised of a crystalline-Si emitter 3 is formed on a p-type base 1. The crystalline-Si emitter 3 can be formed by a variety of methods including epitaxy or diffusion from polysilicon or another diffusion source followed by removal of the diffusion source. The wafer is then RCA cleaned with NaOH (NH$_4$OH or KOH), HCl, and H$_2$O$_2$ reagents, followed by removal of the native oxide layer using an aqueous HF dip, ex-situ vapor treatment, and/or an in-situ vapor HF or H$_2$ plasma treatment. The cleaning and removal process leaves very little SiO$_2$ on the crystalline-Si emitter surface with an oxygen content on the order of $7*10^{14}$cm$^{-2}$. A contiguous interfacial wide band gap film 5 is then deposited onto the crystalline-Si emitter 3 prior to any regrowth of SiO$_x$ on the surface of the crystalline-Si emitter 3. If the crystalline-Si 3 is cleaned ex-situ, the wafer should be immediately loaded in the deposition chamber without receiving a H$_2$O rinse prior to deposition. The film 5 may be deposited using any conventional method, including chemical vapor deposition (CVD), molecular beam epitaxy (MBE), physical vapor deposition, or the like. The wide band gap film 5 may be chosen from a number of different silicon compounds including n-$\mu$c-Si:H, SiC, SiN$_x$, and SiO$_x$ (both amorphous or microcrystalline; intrinsic or in-situ doped).

The electrical function of the wide band gap film 5 is to act as a barrier which reduces hole injection to the emitter contact. Specifically, the film 5 acts as a restrictor to hole injection from the base to the emitter contact without substantially increasing the total emitter (emitter plus emitter contact) resistance. This is the same function fulfilled in the prior art by the regrowth of the SiO$_x$ layer that automatically forms after cleaning while the wafer is exposed to ambient conditions prior to deposition of the contact. However, because the film 5 is deposited on the crystalline-Si emitter before SiO$_x$ regrowth and its chemical make-up is precisely controlled, the electrical function of the film 5 which serves as the interface layer of the polyemitter structure will be subject to much less variability in performance compared to a native or regrown SiO$_x$ layer.

In a preferred embodiment, n-$\mu$c-Si:H is used as the film 5 and it should contain a mixed phase microstructure of amorphous-Si and small crystalline-Si grains with a diameter $\leq$40 Å. The presence of small crystalline grains within an amorphous matrix gives this material a high conductivity ($\sigma$>50 ($\Omega$-cm)$^{-1}$) while maintaining a wide band-gap ($\simeq$1.8 eV). Because the band discontinuity of n-$\mu$c-Si:H and is crystalline Si is almost entirely in the valence band, n-$\mu$c-Si:H is an ideal hole barrier for reducing the back diffusion of holes from the base to the emitter contact. Making the in-situ doped n-$\mu$c-Si:H film less than 50 Å thick assures that the film will not contribute to the total emitter resistance. The deposition of thin n-$\mu$c-Si:H films are described in detail in the Example section below.

After deposition of the n-$\mu$c-Si:H interfacial film 5, an in-situ doped n-type polysilicon 7 is deposited as an emitter contact without exposing the film 5 to O$_2$ or H$_2$O vapor (i.e., air). The sequential deposition of film 5 followed by the insitu doped polysilicon 7 prevents the formation of a second native oxide layer at the boundary between the interfacial material and the polysilicon, thereby preventing uncontrolled oxidation of the film 5. In addition to the enhanced performance, the deposition of a controlled interfacial layer between a polysilicon emitter contact and the c-Si emitter will provide improved device yields by eliminating the variables inherent in the SiO$_x$ interfacial layer.

EXAMPLE 1

A preferred method of producing a polyemitter structure in accordance with the present invention involves the use of in-situ n-doped hydrogenated microcrystalline silicon (n-$\mu$c-Si:H) for the controlled interfacial layer (film 5 in FIGS. 1a–c). According to the method, the Si emitter is cleaned by conventional methods such as an RCA clean. The substrates are loaded immediately into a PECVD chamber. The PECVD chamber is brought under vacuum to prevent SiO$_x$ regrowth and the temperature of the substrates is increased to between 200°–350° C. Prior to deposition of a wide band gap film, a gas mixture of silane/hydrogen (SiH$_4$/H$_2$), phosphine/silane/hydrogen (PH$_3$/SiH$_4$/H$_4$), or arsine/silane/hydrogen (As$_3$/SiH$_4$/H$_4$), or other dopant precursors is flowed across the substrates with flow rates in a ratio of about 0.1/10/(500–2000) standard cubic centimeters (sccm), respectively, and a total pressure between about 0.5 to 1.0 Torr is established to allow sufficient time for mixing of the reactive gases. Atomic hydrogen needs to be formed during deposition to produce the microcrystalline structure. Deposition of the n-$\mu$c-Si:H film on the cleaned and crystalline Si emitter is initiated by establishing an RF plasma having a power density of about 0.05 to about 0.2 W/cm$^2$, and ended by removing the plasma and the reactive gases. The power density needs to be high enough to form atomic hydrogen to promote growth of the n-$\mu$c-Si:H fiAm, but it cannot be too high since a gas phase reaction will occur and a powder, rather than a film, will be formed. Keeping the thickness of the film at $\leq$50 Å should result in a negligible increase in the emitter resistance. Polysilicon, of an in-situ or intrinsic type, is then deposited on the n-$\mu$c-Si:H. Preferably, deposition of the polysilicon occurs in the same chamber to prevent the formation of a second native oxide layer at the boundary between the n-$\mu$c-Si:H and the polysilicon emitter contact. Typical conditions for polysilicon deposition include: temperature T=600°–675° C., arsine, phosphine, etc. as a dopant source, 10–500 sccm of SiH$_4$ and a carrier gas, and pressure P=0.2–10 Torr. The result is a semiconductor device comprising a silicon monocrystalline emitter, a thin film of n-μc-Si:H having a thickness of ≦50 Å which is composed of a combination of amorphous silicon mixed with silicon crystallites (~35 Å grain size), and a 1500 Å thick film of polysilicon deposited on the n-μc-Si:H. The polyemitter structure is remarkable in that the polycrystalline layer grows upon the microcrystalline layer without altering the composition of the microcrystalline layer for a deposition temperature below about 675° C.

EXAMPLE 2

Figure 2:
FIG. 2 is a cross-sectional transmission electron micrograph of a 45 Å contiguous film of n-$\mu$c-Si:H deposited on crystalline silicon.

FIG. 2 demonstrates thin n-μc-Si:H films can be deposited on crystalline silicon surfaces. Silicon substrates having the orientation designated by (100), e.g., Si (100), were RCA cleaned, dipped in 10:1 HF for 10–20 seconds and dried without a water rinse. The Si substrates were immediately loaded (<3 minute. delay) into a Plasma Enhanced Chemical Vapor Deposition (PECVD) chamber and placed on a heated susceptor block adapted for heating of the substrates. The chamber was pumped down to approximately $<10^{-5}$ Torr in less than 10 minutes and the temperature of the susceptor was increased to 200° C. Ten minutes prior to deposition, a gas mixture of phosphine/silane/hydrogen ($PH_3/SiH_4/H_4$) was flowed across the substrates with flow rates in a ratio of about 0.1/10/1000 sccm, and a total pressure of 1.0 Torr was established to allow sufficient time for mixing of the reactive gases. Deposition of n-μc-Si:H was initiated by establishing an RF plasma. The n-μc-Si:H film was deposited at an RF power density of about 0.1 W/cm². Under these conditions, a thirty five second deposition was used to produce a film with a thickness of approximately 45 Å. An amorphous silicon nitride cap (SIN) was deposited over the 45 Å film so that high resolution transmission electron microscopy (HRTEM) could be used to confirm that the 45 Å n-μc-Si:H film contained both amorphous and small grain crystalline silicon phases. As is shown in the transmission electron micrograph of FIG. 2, the n-μc-Si:H film 10 was uniform and contiguous with the crystalline silicon 12. The silicon nitride cap 14 helps delineate the top surface of n-μc-Si:H film 10 in FIG. 2. No $SiO_x$ film was observed at the interface indicated by the arrows on opposite sides of FIG. 2.

EXAMPLE 3

Figure 3:
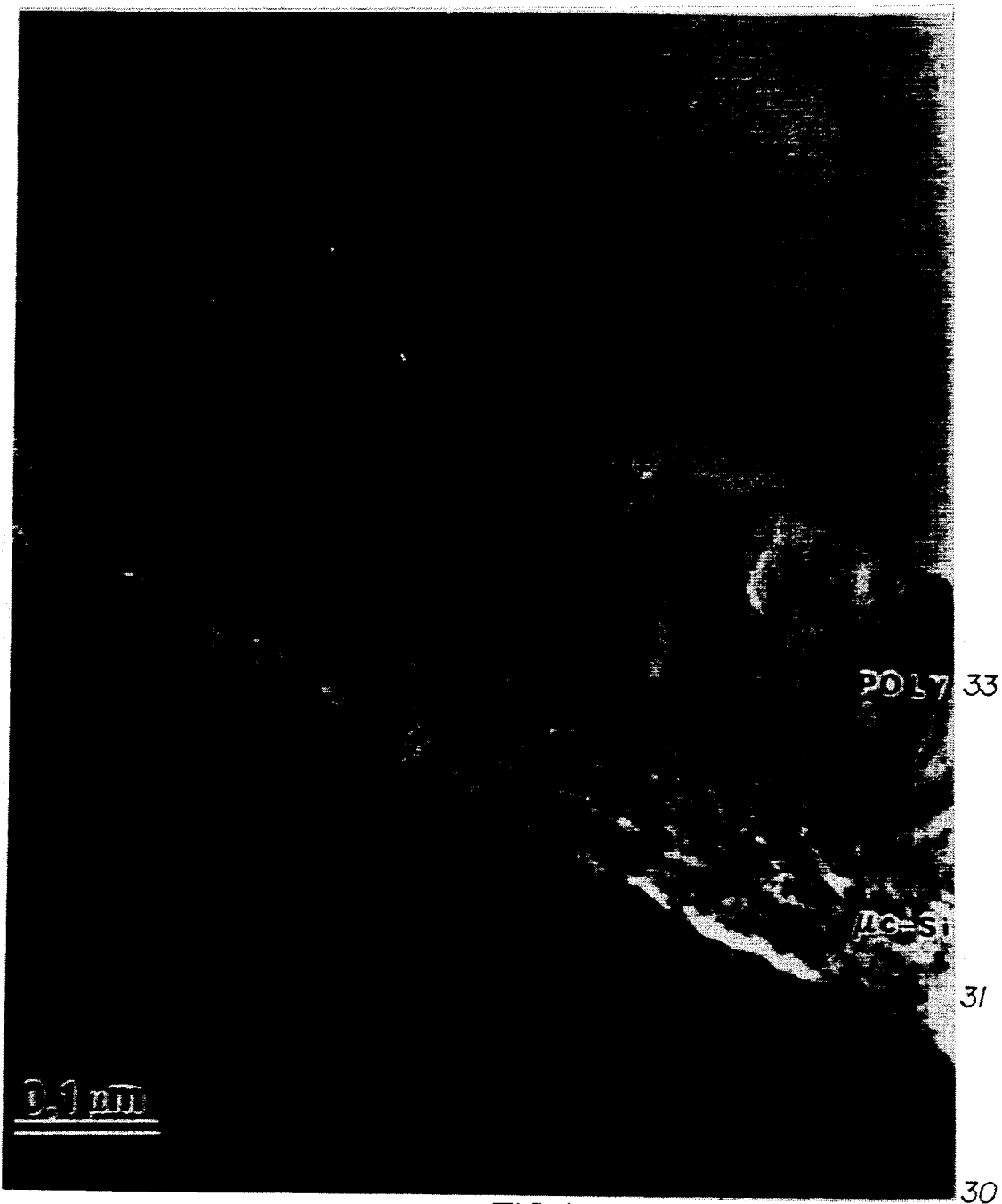
FIG. 3 is a cross-sectional transmission electron micrograph of an intrinsic polysilicon film deposited on top of a n-$\mu$c-Si:H film using LPCVD.

FIG. 3, which is a cross-sectional transmission electron micrograph of an intrinsic polysilicon film 33 deposited on top of a n-μc-Si:H film 31, demonstrates that polycrystalline silicon may be deposited by LPCVD at a temperature of 620° C. on top of n-μc-Si:H without changing the structure of the n-μc-Si:H film. Conventional equipment was used to form the polycrystalline silicon film 33 of FIG. 3; however, it should be understood that new equipment which allows the deposition of both the n-μc-Si:H and in-situ doped polysilicon in the same chamber is currently available. In making the structure of FIG. 3, a thick 1000 Å n-μc-Si:H layer 31 was deposited on a crystalline silicon substrate 30 in a PECVD chamber as described above. The structure was removed from the PECVD chamber, thus exposing it to air and causing some $SiO_x$ regrowth. The structure was then RCA cleaned and loaded into a LPCVD furnace where a layer of polysilicon 33 was deposited on top of the n-μc-Si:H film 31. The deposited 1000 Å n-μc-Si:H layer 31 was maintained at 1000 Å thick during the deposit of the polysilicon film 33; therefore, it can be concluded the polysilicon deposition would not nave an adverse impact on thin films of n-μc-Si:H.

While the invention has been described in terms of its preferred embodiments which can be used singly or in combination, those skilled in the art will recognize that the invention can be practiced with modification within the spirit and scope of the appended claims.

Having thus described our invention, what we claim as new and desire to secure by Letters Patent is as follows:

1. A polyemitter structure, comprising:
    a monocrystalline silicon emitter;
    a polysilicon emitter contact, and
    a uniform and contiguous, conductive n-doped hydrogenated microcrystalline silicon interfacial thin film <50 Å in thickness positioned between said monocrystalline silicon emitter and said polysilicon emitter contact.

2. A polyemitter structure, comprising:
    a monocrystalline silicon emitter on a silicon base;
    a polysilicon emitter contact, and
    a deposited film positioned between said monocrystalline film being conductive, uniform, contiguous, <50 Å thick and serving as a restricter to hole injection from said silicon base to said emitter contact without substantially increasing a total emitter resistance, said deposited film further being selected form the group consisting of n-μc-SI:H, SiC, SiN, and SiO.

* * * * *